(12) United States Patent
Han et al.

(10) Patent No.: US 10,243,171 B2
(45) Date of Patent: Mar. 26, 2019

(54) LAMINATE FOR LIGHT EMITTING DEVICE AND PROCESS OF PREPARING SAME

(71) Applicant: SAINT-GOBAIN GLASS FRANCE, Courbevoie (FR)

(72) Inventors: Jin-Woo Han, Seoul (KR); Young-Seong Lee, Seoul (KR)

(73) Assignee: SAINT-GOBAIN GLASS FRANCE, Courbevoie (FR)

(*) Notice: Subject to any disclaimer, the term of this patent is extended or adjusted under 35 U.S.C. 154(b) by 387 days.

(21) Appl. No.: 14/905,542

(22) PCT Filed: Jul. 16, 2014

(86) PCT No.: PCT/KR2014/006436
§ 371 (c)(1),
(2) Date: Jan. 15, 2016

(87) PCT Pub. No.: WO2015/009054
PCT Pub. Date: Jan. 22, 2015

(65) Prior Publication Data
US 2016/0155990 A1 Jun. 2, 2016

(30) Foreign Application Priority Data
Jul. 17, 2013 (KR) .................. 10-2013-0084314

(51) Int. Cl.
*B32B 15/04* (2006.01)
*B32B 17/06* (2006.01)
(Continued)

(52) U.S. Cl.
CPC .......... *H01L 51/5275* (2013.01); *C03C 3/066* (2013.01); *C03C 8/04* (2013.01);
(Continued)

(58) Field of Classification Search
USPC ................. 428/426, 428, 432, 688
See application file for complete search history.

(56) References Cited

U.S. PATENT DOCUMENTS 5,776,884 A 7/1998 Martin
5,780,371 A 7/1998 Rifqi et al.
(Continued)

FOREIGN PATENT DOCUMENTS

CN 1899696 A 1/2007
CN 103000817 A 3/2013
(Continued)

OTHER PUBLICATIONS

International Search Report as issued in International Patent Application No. PCT/KR2014/006436, dated Oct. 22, 2014.
(Continued)

*Primary Examiner* — Lauren R Colgan
(74) *Attorney, Agent, or Firm* — Pillsbury Winthrop Shaw Pittman LLP

(57) ABSTRACT

Provided is a laminate for a light emitting device. The laminate for a light emitting device includes a glass substrate having potassium or a glass substrate coated with a mineral layer containing potassium, and an internal light extraction layer formed from a glass frit on the glass substrate. The internal light extraction layer includes an interface void layer at an interface with the glass substrate or the mineral layer. The laminate has an interface void layer inducing the scattering of light for effectively extracting light, which is lost at the interface between the substrate and the internal light extraction layer, to the outside. The laminate is suitable for the fields of optical devices such as organic light emitting diodes (OLEDs), backlights, lighting industry, etc.

38 Claims, 11 Drawing Sheets

(51) Int. Cl.
  *H01L 51/52* (2006.01)
  *H05B 33/22* (2006.01)
  *C03C 3/066* (2006.01)
  *C03C 8/04* (2006.01)
  *C03C 8/16* (2006.01)
  *C03C 17/00* (2006.01)

(52) U.S. Cl.
  CPC .............. *C03C 8/16* (2013.01); *C03C 17/008* (2013.01); *H01L 51/5268* (2013.01); *H05B 33/22* (2013.01)

(56) References Cited

U.S. PATENT DOCUMENTS

| | | | |
|---|---|---|---|
| 6,905,991 B1* | 6/2005 | El Khiati | C03B 27/00 501/70 |
| 8,368,064 B2 | 2/2013 | Wada et al. | |
| 8,427,045 B2 | 4/2013 | Nakamura et al. | |
| 8,431,943 B2 | 4/2013 | Nakamura et al. | |
| 8,729,593 B2 | 5/2014 | Nakamura et al. | |
| 9,206,074 B2 | 12/2015 | Yanase et al. | |
| 9,570,709 B2* | 2/2017 | Lee | H01L 51/0096 |
| 9,634,290 B2* | 4/2017 | Lee | H01L 51/0096 |
| 2007/0179039 A1 | 8/2007 | El Khiati et al. | |
| 2009/0224660 A1* | 9/2009 | Nakanishi | H01L 51/5262 313/504 |
| 2011/0001159 A1* | 1/2011 | Nakamura | B82Y 20/00 257/98 |
| 2011/0278635 A1 | 11/2011 | Nakamura et al. | |
| 2012/0155093 A1* | 6/2012 | Yamada | H01L 51/5275 362/311.01 |
| 2012/0187435 A1* | 7/2012 | Gy | C03C 17/3411 257/98 |
| 2012/0313134 A1 | 12/2012 | Vermersch et al. | |
| 2013/0186467 A1 | 7/2013 | Saeki et al. | |
| 2013/0187141 A1* | 7/2013 | Nakamura | H01L 51/5268 257/40 |
| 2013/0264555 A1* | 10/2013 | Ishibashi | G02B 5/0236 257/40 |
| 2014/0234583 A1 | 8/2014 | Ryu et al. | |
| 2015/0014668 A1 | 1/2015 | Dobbertin et al. | |
| 2016/0020416 A1 | 1/2016 | Guimard et al. | |

FOREIGN PATENT DOCUMENTS

| | | |
|---|---|---|
| JP | H05-65478 A | 3/1993 |
| JP | 2006-028010 A | 2/2006 |
| JP | 2006-193385 A | 7/2006 |
| JP | 2007-242286 A | 9/2007 |
| JP | 2007-287486 A | 11/2007 |
| JP | 2009-054424 A | 3/2009 |
| JP | 2012-069920 A | 4/2012 |
| JP | 2013/025900 A | 2/2013 |
| JP | 2013-518361 A | 5/2013 |
| KR | 10-2010-0051631 A | 5/2010 |
| KR | 10-2010-0101076 A | 9/2010 |
| KR | 10-2010-0138939 A | 12/2010 |
| KR | 10-2011-0108373 A | 10/2011 |
| KR | 10-2011-0113177 A | 10/2011 |
| KR | 10-2011-0116142 A | 10/2011 |
| KR | 10-20120069575 A | 6/2012 |
| KR | 10-2013-0009704 A | 1/2013 |
| RU | 2479072 C2 | 9/2011 |
| TW | 201228977 A1 | 7/2012 |
| TW | 201318962 A1 | 5/2013 |
| WO | WO 02/37568 A1 | 5/2002 |
| WO | WO 2010/058755 A1 | 5/2010 |
| WO | WO 2010/077521 A2 | 7/2010 |
| WO | WO 2009/017035 A1 | 10/2010 |
| WO | WO 2012/043828 A1 | 4/2012 |
| WO | WO 2012/086396 A1 | 6/2012 |
| WO | WO 2012/125321 A2 | 9/2012 |
| WO | WO 2013/102530 A1 | 7/2013 |
| WO | WO 2012/090695 A1 | 6/2014 |
| WO | WO 2014/135817 A1 | 9/2014 |

OTHER PUBLICATIONS

Extended European Search Report as issued in European Patent Application No. 14827099.4, dated Mar. 10, 2017.
International Preliminary Report on Patentability and the Written Opinion of the International Searching Authority as issued in International Patent Application No. PCT/KR2014/006436, dated Jan. 19, 2016.
Office Action as issued in Japanese Patent Application No. 2016-527929, dated May 8, 2018.
Search Report as issued in Russian Patent Application No. 2016104511, dated Mar. 28, 2018.

* cited by examiner

LAMINATE FOR LIGHT EMITTING DEVICE AND PROCESS OF PREPARING SAME

CROSS-REFERENCE TO RELATED APPLICATIONS

This application is the U.S. National Stage of PCT/KR2014/006436, filed Jul. 16, 2014, which in turn claims priority to Korean patent application number 10-2013-0084314 filed Jul. 17, 2013. The content of these applications are incorporated herein by reference in their entireties.

TECHNICAL FIELD

The present invention relates to a laminate for a light emitting device and a process of preparing the same, wherein the laminate comprises an interface void layer inducing scattering of light for enhancing external light efficiency by minimizing a loss of light at an interface between a glass substrate and an internal light extraction layer. The laminate for a light emitting device of the present invention is particularly suitable for the fields of optical devices such as organic light emitting diodes (OLEDs), backlights, lighting industry, etc.

BACKGROUND

Optical devices, for example, OLEDs, may be categorized into a bottom emission structure in which light is emitted toward a glass substrate, and a top emission structure in which light is emitted in a direction opposite to a glass substrate, depending on the emission structure. In the bottom emission structure, a cathode acts as a reflector by using a metal thin film of aluminum or the like, and an anode acts as a path, through which light is emitted, by using a transparent oxide conductive film of indium tin oxide (ITO) or the like. In the top emission structure, a cathode is formed as a multi-layer thin film including a very thin silver thin film, and light is emitted through the cathode. In the field of lighting panels, with the exception of transparent panels in which light is emitted through both surfaces, the bottom emission structure is generally used and the top emission structure is rarely used.

In a laminate used for optical devices such as an OLED, only about 20% of emitted light is emitted externally, and about 80% of the emitted light is lost. This is caused by one of two reasons: a wave-guiding effect due to a difference in refractive indexes among a glass substrate, a transparent electrode and an organic layer; and a total reflection effect due to a difference in refractive indexes between the glass substrate and air.

This is because a planar waveguide is naturally formed in the OLED due to conditions in which a refractive index of an internal organic layer is about 1.7 to 1.8, a refractive index of ITO generally used as a transparent electrode is about 1.9, a thickness of the two layers is about 200 nm to 400 nm (being very thin), and a refractive index of the glass used as a substrate is about 1.5. The amount of light lost by the wave-guiding effect is calculated to be about 45% of the emitted light.

Moreover, since a refractive index of the glass substrate is about 1.5 and a refractive index of external air is 1.0, light which is incident at a critical angle or more when light is emitted externally from the glass substrate causes total reflection and is isolated inside the glass substrate. The amount of the isolated light is about 35% of the emitted light.

As a result, in the laminate used for an optical device, only about 20% of the emitted light is emitted externally due to the wave-guiding effect among the glass substrate, the transparent electrode and organic layer, and the total reflection effect between the glass substrate and air. Since the light emission efficiency of optical devices, such as OLEDs, is as low as the level described above, the external light efficiency of the optical device also remains at a low level.

Accordingly, to enhance the external light efficiency of optical devices, technology for extracting light insolated inside the optical device is needed. Technologies relating to light extraction is progressively drawing much attention as being the core technology that increases efficiency, luminance, and service life of optical devices. External light extraction technology and internal light extraction technology are two types of light extraction technologies. External light extraction technology involves extracting light isolated inside a glass substrate, while internal light extraction technology involves extracting light isolated between an organic layer and ITO.

In the external light extraction technology, technology that adheres a micro-lens array (MLA) film, a light scattering film or the like to the outside of an optical device to enhance light efficiency has been established to a certain degree. However, the internal light extraction technology has not yet reached the level of practical application. The internal light extraction technology is theoretically deemed to be effective for enhancing external light efficiency of optical devices by three times or more. However, since the interface characteristics between an internal light extraction layer and a transparent electrode layer significantly influences the service life of optical devices and the physical characteristics of the material used as the internal light extraction layer significantly influences certain characteristics, such as thermal stability of optical devices, the technology must satisfy electrical, mechanical, and chemical characteristics at all levels, in addition to providing sufficient optical effect.

According to previous studies, an internal light scattering layer, deformation of a substrate surface, a refractive index adjustment layer, photonic crystals, a nanostructure forming method, etc., are known to be effective for extracting internal light. The main objective of the internal light extraction technology is to scatter, diffract, or refract light isolated due to the wave-guiding effect in order to form an incident angle less than or equal to the critical angle, thereby extracting light past an optical waveguide.

Patent Documents 1 to 3 disclose a method that extracts light from the inside by using two materials having different refractive indexes. The patent documents use a base material having a high refractive index (a first refractive index) and a plurality of scattering materials (e.g., air bubbles or precipitation crystals) having a second refractive index different from the first refractive index of the base material included in the base material, as an internal light extraction layer. In the case where a glass frit is used as the base material, and air bubbles are used as the scattering material, a spherical air bubble is formed by way of an internal gap of glass when sintering the glass fit, or by generating a gas such as carbon dioxide ($CO_2$) formed from decomposing a material such as an organic material adhered to a surface of a glass layer when glass is softened. Also, the patent documents use the high priced PD200 substrate, manufactured by Asahi Glass Co., Ltd., as a glass substrate.

Patent Document 4 discloses an internal light extraction layer comprising inorganic phosphor powders as a plurality of scattering materials. When a glass substrate containing alkali metal is used as a glass substrate, alkali metal components are diffused, which affect the characteristics of scattering materials inside a scattering layer. In particular, when the scattering materials are phosphors, the phosphors cannot exhibit its characteristics because the phosphors are weakened by the alkali component. For this reason, Patent Document 4 also uses the high priced PD200 substrate, manufactured by Asahi Glass Co., Ltd., as a glass substrate for preventing alkali metal from being diffused.

Patent Documents 5 and 6 disclose an air bubble, precipitation crystal, particles different from a base material and powdered glass as examples of a plurality of scattering materials, and use a sodalime substrate as a glass substrate.

The methods described in the above patent documents disclose a common feature since an air bubble, which is generated by a gap in sintering a glass fit or generated by oxidizing a material adhered to a surface of a glass substrate, or an additional different material (crystal, phosphor or the like) is used as a scattering material. When the air bubble is used as the scattering material, a strong scattering effect can be obtained. However, since the air bubbles naturally gather at an upper portion of an internal light extraction layer due to their property of rising upwards when they are generated by an internal gap of glass, it is difficult to adjust the density or distribution of the air bubbles to a desired level. Also, when the air bubble is generated by the gap of particles of the glass fit, flexures are formed at a surface of the internal light extraction layer, causing a short circuit in the electrodes. When the air bubble is generated by oxidizing a material adhered to a surface of a glass layer, an additional process is needed to treat the surface of the glass substrate. Furthermore, as in the patent documents, when scattering particles are randomly distributed in the internal light extraction layer, the multi scattering of incident light results in an increase in the loss of light, causing a reduction in the transmittance of visible light.

For this reason, when a gas, especially air, is used as a scattering material, adding an additional scattering material is unnecessary, thereby providing a simple preparing process by which a strong scattering effect can be obtained. However, there still remains a need for a method that concentrates the gases at an interface between the internal light extraction layer and the glass substrate (and not at the upper portion of the internal light extraction layer) when gases are used as a scattering material.

PRIOR ART

Patent Documents (Patent Document 1) Korean Patent Publication No. 10-2010-0051631
(Patent Document 2) Korean Patent Publication No. 10-2010-0101076
(Patent Document 3) Korean Patent Publication No. 10-2011-0116142
(Patent Document 4) Korean Patent Publication No. 10-2010-0138939
(Patent Document 5) Korean Patent Publication No. 10-2011-0113177
(Patent Document 6) Korean Patent Publication No. 10-2011-0108373

SUMMARY

The present invention provides a laminate for a light emitting device that includes an interface void layer at an interface between a glass substrate and an internal light extraction layer, and in which the interface void layer induces (preferably alone) the scattering of light at a surface of the interface void layer to effectively extract light to the outside. By doing so, it can significantly improve the light efficiency of the light emitting device, which preferably has a uniform haze ratio within an entire wavelength range of visible light (380 nm to 780 nm).

The present invention also provides a laminate for a light emitting device, in which adding an additional material as a scattering element is unnecessary, and an element scattering light is formed at an interface between the glass substrate and the internal light extraction layer rather than over the entire internal light extraction layer. As such, flexures or air bubbles are prevented from being formed at an upper surface of the internal light extraction layer, allowing the internal light extraction layer to have a smooth upper surface.

The present invention also provides a process of preparing a laminate for a light emitting device, which is effective and economical due to its simplicity, that can effectively adjust a thickness and void area ratio of an interface void layer of the laminate for a light emitting device.

The present invention also provides a laminate for a light emitting device with a transparent electrode formed thereon, preferably in contact with the internal extraction layer.

According to an aspect of the present invention, disclosed is a laminate for a light emitting device comprising: a glass substrate comprising potassium or coated with a mineral layer comprising potassium; and an internal light extraction layer having a refractive index of 1.8 to 2.1, formed from a glass frit on said glass substrate, wherein the internal light extraction layer comprises an interface void layer at an interface with the glass substrate.

According to another aspect of the present invention, disclosed is process for preparing a laminate for a light emitting device comprising the steps of: preparing a glass substrate comprising potassium or coated with a mineral layer comprising potassium; applying a glass frit paste onto said glass substrate to form a glass frit layer; drying said glass frit layer; and sintering said dried glass frit layer to form an internal light extraction layer having a refractive index of 1.8 to 2.1, wherein the formed internal light extraction layer comprises an interface void layer at an interface with the glass substrate. Here, said glass frit layer is preferably sintered at a temperature between 500° C. and 590° C. A suitable sintering temperature for forming said interface void layer may be applied, which may depend on the frit composition and ultimate thickness of an internal light extraction layer.

The potassium in said glass substrate diffuses toward a lower part of the glass frit layer during sintering of said glass frit layer, thereby raising the densification temperature of the lower part of the glass frit layer.

According to another aspect of the present invention, the process of preparing a laminate for a light emitting device may further comprise: the steps of applying another glass frit layer onto said sintered glass frit layer (a first glass fit layer) to form a second glass frit layer; drying said second glass fit layer; and sintering said dried second glass fit layer to form an internal light extraction layer having refractive index of 1.8 to 2.1.

Any suitable potassium-containing sodalime substrate having sufficient potassium, for example, as disclosed in U.S. Pat. Nos. 6,905,991, 5,780,371, 5,776,884, may be used as the glass substrate. Among the references above, a glass composition comprising 3 to 7.5% of $K_2O$ by weight is described in Embodiments 1 to 12 of U.S. Pat. No.

6,905,991 (see columns 11 and 12), which comprises preferably not more than 10% of other alkali metals to prevent adverse influence on the diffusion of potassium.

Further, a glass substrate generally used for optical devices, devoid of or having an insignificant amount of potassium (as an impurity, for example, below 1% by weight), can be used after treating with potassium (e.g., contacting the substrate with a potassium source before the sintering of the frit). Thereafter, the surface or the outermost region of said glass becomes richer with sufficient potassium. The concentration of potassium at the surface of said glass substrate after sintering may be 1 to 15% by weight, preferably less than 5% by weight.

Further, a glass substrate generally used for optical devices can be used after coating with a mineral layer comprising potassium layer, instead of a glass substrate comprising potassium. Said mineral layer can be formed, for example, from a low-refractive index glass fit containing potassium. In this case, the refractive index of the low-refractive index glass frit is preferably similar to that of the glass substrate.

Furthermore, the concentration of potassium of the internal light extraction layer after sintering may become smaller than the interface between the glass substrate and the internal light extraction layer to an outermost surface of the internal light extraction layer. The concentration of potassium at the outermost surface of said internal light extraction layer is preferably less than 1% by weight.

The glass frit used for the internal extraction layer having the interface void layer may comprise 55 to 84% by weight $Bi_2O_3$, 0 to 20% by weight BaO, 5 to 20% by weight ZnO, 1 to 7% by weight $Al_2O_3$, 5 to 15% by weight $SiO_2$, 5 to 20% by weight $B_2O_3$, and 0.05 to 3% by weight $Na_2O$, based on the total weight of the glass fit.

The internal light extraction layer may consist of a single layer of glass fit, wherein the glass substrate has a single coating of a glass fit paste. The single glass frit layer preferably has a smooth surface and is devoid of scattering elements protruding at the surface, even on the entire surface of the interface void layer.

Moreover, the internal light extraction layer may consist of a double layer of glass frit formed from coating a double coating of glass frit paste. The glass fit paste for each of the coatings may have the same composition so that the interface between glass frit layers is not visible, or it may have different compositions so that the interface between glass frit layers is visible. The second glass frit layer formed from the second coating of glass frit paste preferably has a smooth surface, does not form a void layer at the interface with the first glass frit layer, and is devoid of scattering elements.

The internal light extraction layer, whether it be a single or double layer, may have a total thickness of 6 to 30 μm, preferably 10 μm to 25 μm. The internal light extraction layer has a refractive index (RI) of 1.8 to 2.1 at 550 nm or even in the full range of visible light, preferably at least 1.9. Roughness (Ra) of the surface of said internal light extraction layer is preferably less than 1 nm.

The internal light extraction layer may comprise an interface void layer at an interface with the glass substrate or the mineral layer. The interface void layer may have a thickness of 1 to 5 μm, and the interface void layer may have a void area ratio of 40 to 90%. The thickness and void area ratio of the interface void layer is measured by a Scanning Electron Microscope (SEM). The void area ratio can be obtained to divide an area of void into a total area of interface void layer.

In the laminate for a light emitting device of the present invention, widely-used glass substrates such as a sodalime glass substrate can be used as a substrate. Further, the internal light extraction layer can be prepared using a simple and economical process, without additional surface-treatment process of the substrate to prevent diffusion of alkali metal, or adding scattering elements.

Further, in the laminate for a light emitting device of the present invention, since the void, which is the scattering material, is concentrated at the interface between a substrate and an internal light extraction layer, the internal light extraction layer may have a smooth surface without curvature. As such, further treatment of the surface of the internal light extraction layer is not needed without any problems, such as a short circuit in the electrodes. Also, the shape or void area ratio of void in the interface void layer can be controlled by the sintering temperature and time.

Moreover, using the laminate for a light emitting device of the present invention, the light which will be lost at the interfaces can be effectively extracted to the outside. In this regard, the total transmittance of visible light and light transmittance to the vertical direction is far superior and the haze ratio at the range of visible light wavelength is uniform, as compared to a conventional scattering type laminate for a light emitting device using bubbles as a scattering element and having the same diffusion performance, while maintaining other optical characteristics such as absorbance at a level that is similar or superior to the conventional scattering type laminate for a light emitting device.

DETAILED DESCRIPTION

Terms

Hereinafter, the terms used in the specification will be described.

When the term "about" is used together with a numerical value, "about" is construed to imply all values including an error range within a significant figure of a corresponding numerical value.

The term "laminate" denotes a structure in which two or more layers are stacked, and may be separately used in an electronic device, or used in a state where another layer (for example, transparent electrode, or the like) is additionally stacked on the laminate.

The term "glass frit" is a raw material for forming an internal light extraction layer, and may denote a glass powder, or a paste state in which a solvent, a binder, etc., are mixed with the glass powder. It should be understood that the term "frit" used in the specification denotes the glass frit.

The term "glass frit layer" denotes a layer in which a paste comprising the glass frit is applied on a substrate.

The term "internal light extraction layer" denotes a layer which is formed after the glass frit layer is sintered (glass frit being melted). When the internal light extraction layer is used for an optical device such as an OLED, the internal light extraction layer is formed between the substrate and the transparent electrode, prevents light emitted from a light emission layer (organic layer) from being lost due to a refractive index difference among the substrate, a transparent electrode layer and the organic layer, and effectively extracts light, which is isolated in the inside due to a refractive index difference between the substrate and air, to the outside the substrate. Another material, such as an additive, in addition to the glass fit, may be additionally contained in the internal light extraction layer including even (small content of) scattering particles.

Figure 1:
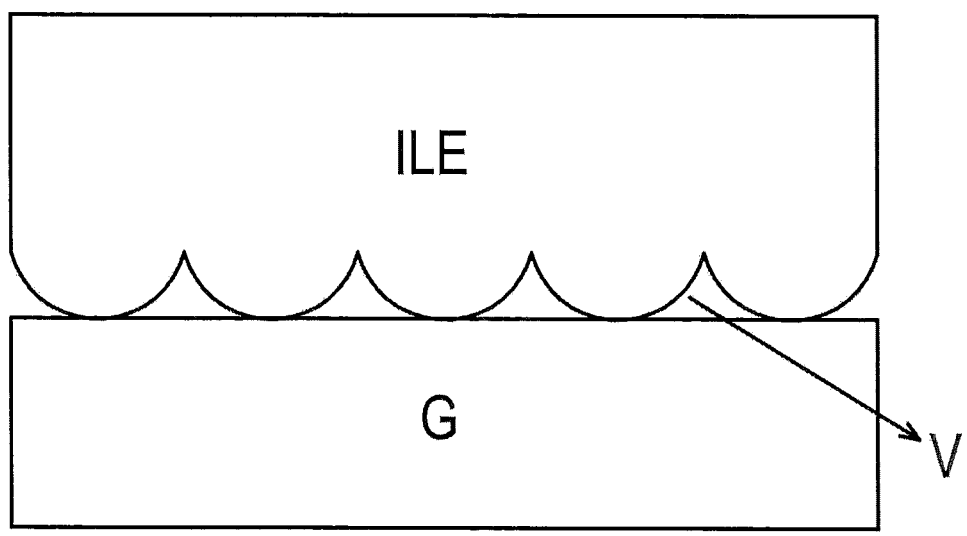
FIG. 1 is a schematic view showing a laminate for a light emitting device comprising an internal light extraction layer according to an embodiment of the present invention.

The term "interface void layer" is a layer full of voids (open porosities) in contact with the glass substrate or the coated glass substrate with a mineral layer. However, the interface void layer is not easily separated from the glass substrate or the coated glass substrate by an external impact, heat, and a physical external force, and induces the scattering of light. FIG. 1 is a schematic view illustrating a laminate for a light emitting device comprising an internal light extraction layer according to an embodiment of the present invention. "ILE" indicates Internal Light Extraction Layer, whose reflective index is from 1.8 to 2.1, "G" indicates Glass Substrate, and "V" indicates Void whose reflective index is about 1.

The term "laminate for a light emitting device" denotes a structure in which the internal light extraction layer is stacked on the substrate.

<Substrate>

The substrate used in the present invention comprises potassium or is coated with a mineral layer comprising potassium. The substrate may preferably be a glass substrate, which acts as a support for the light emitting device, having a thickness of 150 μm to several millimeters. The thickness of the glass substrate is preferably 0.3 to 2.0 mm or even 0.5 to 1 mm. The glass substrate (or the coated glass substrate) in the present invention could be sodalime, borosilicate, etc., or a glass-ceramic type substrate regardless of the haze ratio of the glass substrate.

The transmittance of visible light of the glass substrate is preferably at least about 70%.

Any substrate that can endure a high-temperature sintering process may be used in the present invention.

A sodalime glass substrate may be used as the glass substrate, and potassium may be injected into or coated on the glass substrate devoid of potassium or containing an insufficient amount of potassium (e.g., potassium is present only as an impurity). Any known treatment methods may be used, including but not limited to spin-coating, dipping, self-assembled monolayer (SAM) treatment, ion exchanging method, sol-gel coating, or the like.

<Glass Frit>

The glass frit of the present invention is a raw material suitable for forming an internal light extraction layer, and may be a powder or a paste. Due to the ease at which a high refractive index is achieved, a glass frit is a very useful raw material in forming the internal light extraction layer. Therefore, the glass frit described in the specification may be applied to all internal light extraction layers containing a glass material. When forming the internal light extraction layer by sintering the glass frit, a composition of a glass material is the same as that of a glass material contained in the internal light extraction layer. Thus, the following features of the glass frit composition correspond to the features of a composition of the glass material contained in the internal light extraction layer.

The glass fit for the internal light extraction layer has a refractive index of 1.8 to 2.1, preferably 1.85 to 2.0. The range of the refractive index is the value corresponding to a refractive index of each of the light transmissive electrode layers and the organic layer of a general optical device, particularly an OLED device, and is for minimizing an influence of a refractive index difference on light extraction efficiency.

The thermal expansion coefficient could be 70 to 90× $10^{-7}/°$ C. The thermal expansion coefficient is set as a range for preventing the glass substrate (which is a light transmissive substrate that is the basis of formation of the internal light extraction layer) from being deformed or deteriorated in a process of sintering the fit.

The glass fit of the present invention comprises 55 to 84% by weight $Bi_2O_3$, 0 to 20% by weight BaO, and preferably 5 to 20% by weight ZnO, 1 to 7% by weight $Al_2O_3$, 5 to 15% by weight $SiO_2$, 5 to 20% by weight $B_2O_3$, and 0.05 to 3% by weight $Na_2O$, based on the total weight of the glass frit.

$Bi_2O_3$ is an essential component for lowering a densification temperature of the glass frit and increasing a refractive index, and BaO is an assistant component that may be combined with $Bi_2O_3$ for increasing a refractive index. The $Bi_2O_3$ content in the glass frit may be preferably 60 to 80% by weight, more preferably 62 to 78% by weight, and most preferably 65 to 75% by weight. The BaO content may be preferably 0 to 10% by weight, more preferably 0 to 5% by weight, and most preferably 0 to 2% by weight. In some embodiments, the BaO content may be zero (0). When the $Bi_2O_3$ content is less than the lowest limit of the ranges above, it is difficult to achieve a refractive index range of 1.8 to 2.1 due to a lowered refractive index, and moreover, an increase in sintering temperature, which is not preferable. When the $Bi_2O_3$ content is greater than the upper most limit of the ranges above, absorption of blue-range light by the glass fit become stronger, and the thermal stability in the sintering decreases, causing a deterioration of the surface of the internal light extraction layer. Since BaO is weak in lowering a densification temperature of the glass frit, BaO may replace a part of the $Bi_2O_3$. However, when the content of BaO is greater than the upper most limit of the ranges above, a sintering temperature exceeds the suitable range.

ZnO is a component for lowering a densification temperature of the glass fit. The ZnO content in the glass fit may be 5 to 20% by weight, preferably 5 to 15% by weight, and more preferably 5 to 13% by weight. When the content of ZnO is greater than the upper most limit of the ranges above, it is not preferable because a phase of the glass frit becomes unstable, acid tolerance is weakened, and the absorption of green-range light by the glass fit becomes stronger.

$Al_2O_3$ is a component for stabilizing the phase of the glass frit. The $Al_2O_3$ content in the glass frit may be 1 to 7% by weight, preferably 1.5 to 5% by weight, and more preferably 2 to 4% by weight. When the $Al_2O_3$ content is less than the lowest limit in the above ranges, it is not preferable because the phase of the glass frit becomes unstable and the chemical resistance is weakened. When the $Al_2O_3$ content is greater than the upper most limit of the above ranges, it is not preferable because the refractive index of the glass fit is lowered and the sintering temperature increases.

$SiO_2$ is a component for stabilizing the phase of the glass fit. The $SiO_2$ content in the glass fit may be 5 to 15% by weight, preferably 6 to 14% by weight, and more preferably 7 to 12% by weight. When the $SiO_2$ content is less than the lowest limit of the above ranges, it is not preferable because the phase of the glass frit becomes unstable. When the $SiO_2$ content is greater than the upper most limit of the above ranges, it is not preferable because the refractive index of the glass fit is lowered and the sintering temperature increases.

$B_2O_3$ is a component for lowering the thermal expansion coefficient, stabilizing the phase of the glass fit, and lowering the densification temperature. The $B_2O_3$ content in the glass frit may be 5 to 20% by weight, preferably 6 to 15% by weight, and more preferably 7 to 12% by weight. When the $B_2O_3$ content is less than the lowest limit of the above ranges, it is not preferable because the phase of the glass frit becomes unstable. When the $B_2O_3$ content is greater than the upper most limit of the above ranges, it is not preferable because the water resistance of the internal light extraction layer is weakened.

$Na_2O$ is a component added for lowering the densification temperature of the glass frit. The $Na_2O$ content in the glass frit may be 0.05 to 3% by weight, preferably 0.1 to 2% by weight, and more preferably 0.5 to 1.5% by weight. When the $Na_2O$ content is less than the lowest limit of the above ranges, it is not preferable because the sintering temperature of the glass fit increases. When the $Na_2O$ content is greater than the upper most limit of the above ranges, it is not preferable because a chemical resistance is weakened.

The glass frit may contain an unavoidable small amount of $TiO_2$ or $ZrO_2$ (e.g., 0.05% by weight or less), but not more.

Furthermore, the glass frit may not contain any one of Nb, P, Pb, Ta, Y, Sn, Gd, La, V, and Mo.

Here, a composition of the glass frit according to an embodiment of the present invention does not contain any transition metals such as Fe, V, Cr, Mn, Ni, Co, Cu, Pd, Ag, Au, Pt, Cd, but may optionally contain a small amount of Ce. Transition metals suppress a high-temperature reduction of $Bi_2O_3$ or the like to thereby prevent the yellowing of a film during the sintering process. Thus, a transition element is generally added into the glass frit with $Bi_2O_3$. However, all transition metals show a strong absorbing characteristic within a specific light wavelength range, and particularly, when a light path increases due to scattering in the internal light extraction layer, light absorption by a transition element can cause a fatal loss of light. In this regard, it is crucial to avoid adding a transition element into a composition of the glass frit. However, since an oxide of Ce, which is a lanthanoid, is limited to a dark blue range in light absorbing characteristics, a Ce oxide has weak optical influence on an OLED lighting device having a phosphor blue light source. Further, a Ce oxide aids complete burning in a burn-out process of an organic component in preparing the internal light extraction layer. Therefore, $CeO_2$ may be added in an amount of 0.3% by weight or less, and preferably 0.1% by weight. On the other hand, in a specific embodiment of the present invention, $CeO_2$ may not be added.

<Preparation of Laminate for a Light Emitting Device>

Figure 2:
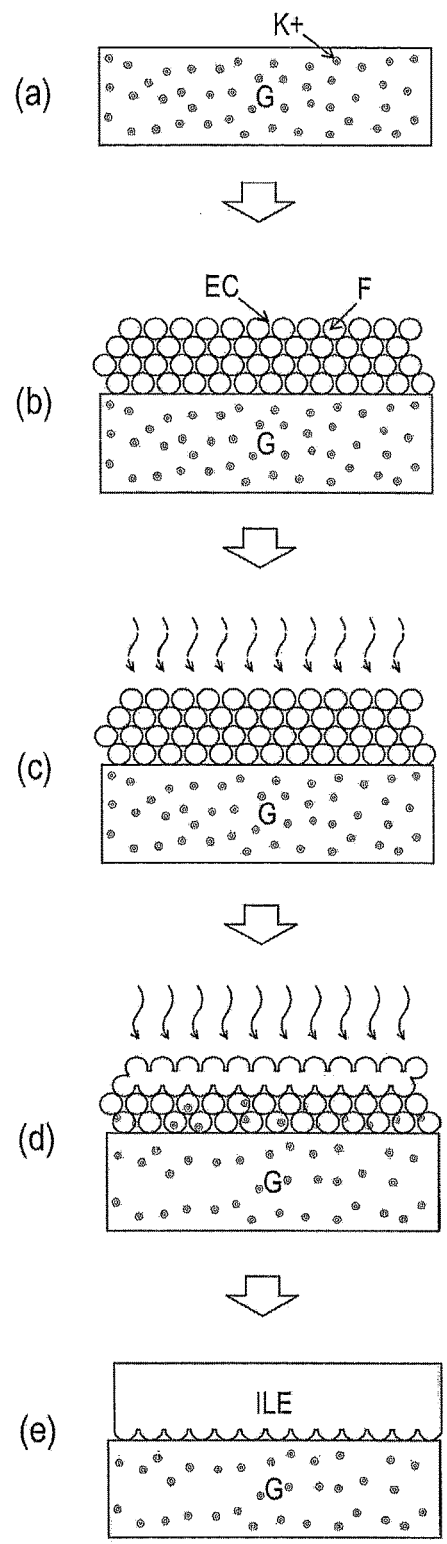
FIG. 2 is a flowchart showing a process of preparing the laminate for a light emitting device comprising the internal light extraction layer according to an embodiment of the present invention.

FIG. 2 is a flowchart illustrating a process for preparing the laminate for a light emitting device according to an embodiment of the present invention. The meaning of "ILE", "V" and "G" are the same as those disclosed in FIG. 1. "F" indicates glass frit before sintering, and "EC" indicates ethyl cellulose.

First, a substrate which contains potassium or has been surface-treated with potassium, or a substrate coated with a mineral layer containing potassium is prepared (step (a)). Basic physical properties, such as refractive index, necessary for the substrate are as described above. A paste including the glass frit (preferably, without scattering particles) is applied on said substrate (step (b)), and then dried (step (c)). A composition of the glass frit included in the paste is as described above, and the paste includes the glass frit in an amount of 70 to 80% by weight and the remaining composition of the paste includes a binder, a solvent, and the like. Any coating method generally known in the art may be used to apply the paste, including but not limited to screen printing, slit die coating, bar coating, roll coating, or the like.

The dried glass frit is sintered at a temperature of 500 to 590° C. (step (d)). Potassium comprised in the substrate is diffused into the glass frit layer during the sintering process. Even an injection of only a small amount of potassium can change the thermal characteristic of the glass frit, such that an interface void layer can be produced (step (e)). Further, since potassium has a slow diffusion rate, a thickness and void area ratio of the interface void layer can be controlled effectively.

Figure 3:
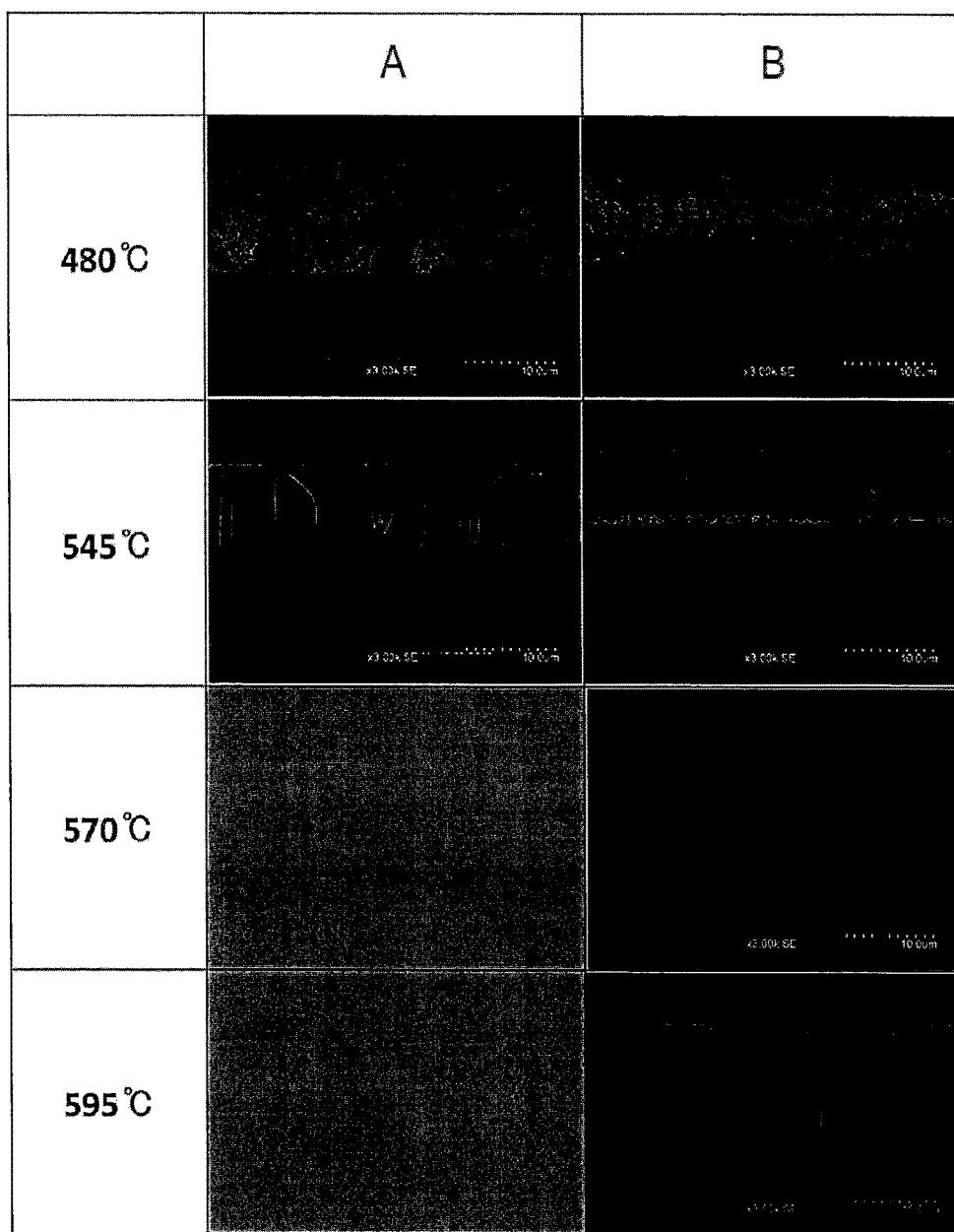
FIG. 3 are Scanning Electronic Microscope (SEM) photographs showing a cross-section of a glass frit layer sintered at a changed sintering temperature, when a sodalime glass substrate containing potassium and a sodalime glass substrate containing no potassium are used.

FIG. 3 shows whether the interface void layer is formed according to whether a sodalime substrate contains potassium, and also shows the changes in the cross-section of the internal light extraction layer. When a glass substrate containing no potassium is used (Column A), the interface void layer is not formed within an entire temperature range, and the interface light extraction layer is formed at 545° C. On the other hand, when a substrate containing potassium is used (Column B), an internal light extraction layer comprising the interface void layer is formed at 545° C., and then, as sintering is slowly performed at the interface of the glass fit, an internal light extraction layer comprising no interface void layer is formed at 595° C. Accordingly, it can be seen that the internal light extraction layer comprising the interface void layer may be prepared by controlling a sintering temperature of the glass fit layer coated on the glass substrate comprising potassium, and moreover, it is possible to adjust a thickness and void area density of the interface void layer.

A small amount of voids may be formed inside the internal light extraction layer during the sintering process irrespective of whether the substrate comprises potassium. This is inevitable in the glass fit layer sintering process, and thus, the voids may be preferably formed so as not to affect a total transmittance, absorbance, and haze ratio of the laminate for a light emitting device.

The concentration of potassium at the surface of the glass substrate or the mineral layer may preferably be 1 to 15% by weight. When the concentration of potassium is greater than the upper limit of 15% by weight, transmittance can be severely reduced. Also, the thickness of the interface void layer may preferably be within a range of 1 to 5 μm. When the thickness of the interface void layer is less than the lower limit, a scattering effect is minimal, and when the thickness of the interface void layer is greater than the upper limit, multi scattering occurs which decreases transmittance, thereby causing a loss of light. A void area ratio of the interface void layer may be adjusted by controlling the sintering time and temperature, and may preferably be 40 to 95%, preferably from 70 to 95% so as to enable light to be efficiently extracted to the outside.

Moreover, since a void is formed at only an interface between the substrate or the mineral layer and the internal light extraction layer, the surface of the internal light extraction layer has minimal air bubbles, unlike the internal light extraction layer which uses air bubbles as a scattering factor. Therefore, the surface roughness of the internal light extraction layer may be preferably formed to be less than 1 nm. Also, the surface roughness of the glass frit layer needs to have a sufficient thickness so as not to be affected by a structure of the interface void layer, for which a multi glass frit layer may be formed. Regardless of the glass fit layer being formed as a single layer or two or more multi-layers, a total thickness of the internal light extraction layer is in the range from 6 to 30 μm, preferably from 10 to 20 μm. When the thickness of the internal light extraction layer is less than 6 μm, a surface roughness of the internal light extraction layer can become 1 nm or more, or increases the risk of air bubbles being generated at the surface. When the thickness of the internal light extraction layer is greater than 30 μm, light extraction efficiency can be reduced.

The laminate for a light emitting device of the present invention can effectively extract light (which is lost at the interface) to the outside, maintain optical characteristics, such as absorbance, etc., at a level equal to or better than conventional scattering type laminates for a light emitting device that uses air bubbles as a scattering factor, have much better total light transmittance and light transmittance in a vertical direction than conventional scattering type laminates for a light emitting device that have the same diffusive performance, and have a far more uniform haze ratio than conventional scattering type laminates within the visible light wavelength range. The laminate for a light emitting device of the present invention may be used in a state where a transparent electrode layer is additionally stacked on the internal light extraction layer, as applied to an optical device such as an OLED. As the transparent electrode layer, indium tin oxide (ITO), transparent conductive oxide (TOC), graphene, or the like can be used. A conventional deposition method of the transparent electrode layer, such as sputtering, may be used.

Of course we can add a barrier layer between the internal light extraction layer and the electrode wherein the barrier layer consists of silicon oxide ($SiO_2$), silicon nitride ($Si_3N_4$), titanium oxide ($TiO_2$), tin oxide ($SnO_2$), silicon oxynitride (SiON) and the like and preferably has an RI of more than 1.8 and a thickness of less than 100 nm. Meanwhile, it is possible to protect the internal light extraction layer during the chemical etching process and increase the light extraction effect by adding the step of depositing a barrier layer whose thickness is 5 to 50 nm on the internal light extraction layer. The barrier layer can be formed as a monolayer or as a multilayer, for example, where $SiO_2$ and $Si_3N_4$ layers are alternatively stacked.

EXAMPLES

Detailed examples are as described below. However, the examples only serve the purpose of providing a better understanding of the present invention, and should not be construed as limiting the scope of the present invention in any way.

Example 1: Preparation of a Laminate for a Light Emitting Device with Potassium-Containing Glass Substrate A glass substrate, which has a thickness of 0.7 mm and comprises 5 wt % $Na_2O$ and 6 wt % $K_2O$, is prepared as described in Embodiment 10 of U.S. Pat. No. 6,905,991. A paste comprising 75 wt % of a glass frit, which comprises 70 wt % of $Bi_2O_3$, 3 wt % of $Al_2O_3$, 10 wt % of ZnO, 7 wt % of $SiO_2$, 9 wt % of $B_2O_3$, and 1 wt % of $Na_2O$ based on the total weight of the glass frit, 3 wt % of ethyl cellulose as a binder, and 22 wt % of solvent based on the total amount of the paste is prepared. The refractive index is 1.91 at 550 nm.

The glass substrate is cleaned, and then the paste comprising the glass frit is applied on the glass substrate by the screen printing method. A solvent is evaporated by drying the coated paste in an oven at a temperature of 130° C. for about 20 minutes. Thereafter, ethyl cellulose contained in the dried paste is removed by leaving the dried paste under a temperature of 430° C. for about 20 minutes.

The prepared glass frit layer is sintered at a temperature of 540° C. for about 10 minutes. Heating to remove ethyl cellulose and sintering of the glass frit layer may be performed by a successive process using a roll hearth furnace (RHF), or may be performed by using separate ovens.

Figure 4:
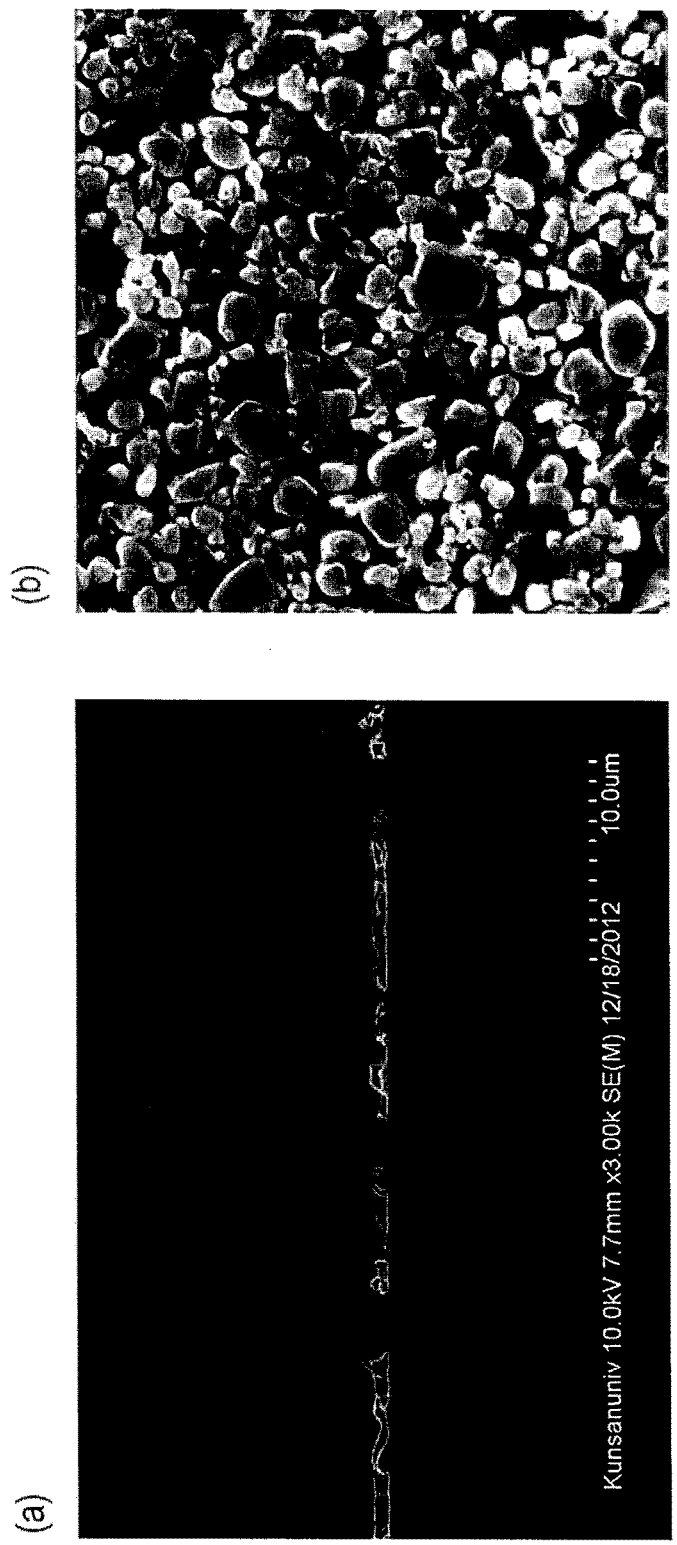
FIG. 4 are SEM photographs respectively showing a cross-section and a bottom of an internal light extraction layer prepared as described in Example 1.

FIG. 4 are SEM photographs showing an internal light extraction layer prepared as described in Example 1. The left photograph (FIG. 4(a)) shows a captured cross section of the internal light extraction layer, and the right photograph (FIG. 4(b)) shows an interface void layer captured in a downward direction. It can be seen that grains of the glass frit remain without being sintered, thereby forming voids between the grains. The size of these grains is about 1 μm to 5 μm.

Figure 5:
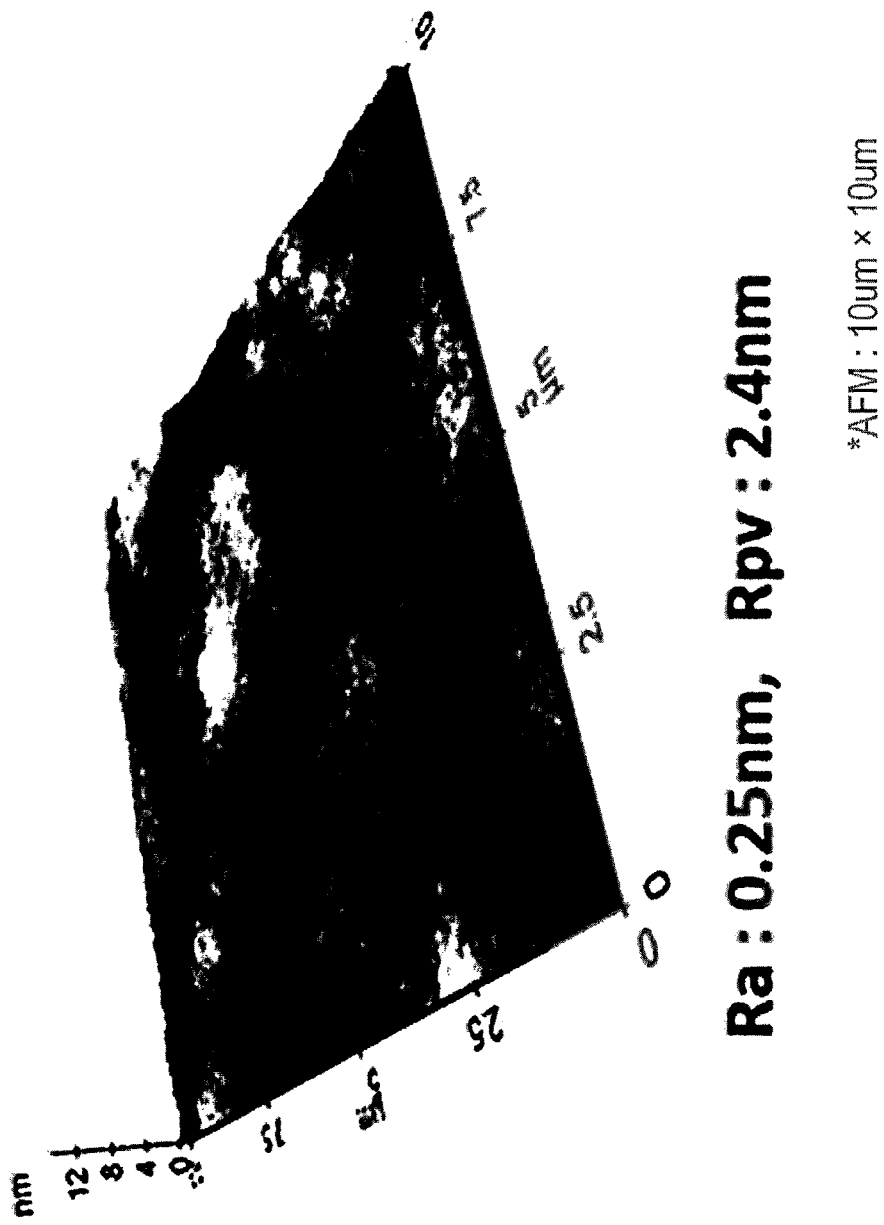
FIG. 5 is an Atomic Force Microscopy (AFM) photograph showing a surface of an internal light extraction layer prepared as described in Example 1.

FIG. 5 is an AFM photograph showing the surface of the internal light extraction layer prepared as described in Example 1. It can be seen that an average value of surface roughness (Ra) is 0.25 nm, which is less than 1 nm.

Example 2: Preparation of a Laminate for a Light Emitting Device with Potassium-Containing Glass Substrate A laminate for a light emitting device comprising an interface void layer is prepared in the same process as Example 1, except that a sintering temperature is set to 550° C.

Example 3: Preparation of a Laminate for a Light Emitting Device with Potassium-Containing Glass Substrate A laminate for a light emitting device comprising an interface void layer is prepared in the same process as Example 1, except that a sintering temperature is set to 560° C.

Example 4: Preparation of a Laminate for a Light Emitting Device with Potassium-Treated Glass Substrate A solution containing a potassium ion is coated on a surface of a float plate glass or a general sodalime glass substrate having a thickness of 0.7 mm using a wetting method. The coated glass substrate is heat-treated at a high temperature of 400° C. or more to induce ion exchange between sodium and potassium ions. After the ion exchange, a surface residual stress of the substrate is 450 MPa, and a stress depth is 15 μm. The remaining processes are performed in the same process as Example 1, thereby preparing a laminate for a light emitting device comprising an interface void layer.

Example 5: Preparation of a Laminate for a Light Emitting Device with a Glass Substrate Coated with a Mineral Layer Comprising Potassium A low-refractive index (n=1.54 at 550 nm) glass fit paste (PA-FD4115C®, provided by Phoenix Materials) containing potassium is coated on a surface of a float plate glass or a general sodalime glass substrate having a thickness of 0.7 mm, which do not comprise potassium or comprise potassium as an amount of impurities, using the screen printing method. After drying and sintering the low-refractive index glass frit paste, a mineral layer having a thickness of about 6 to 12 μm is formed. After forming a glass fit layer in the same composition and process conditions as Example 1, the remaining process is performed as Example 1, thereby preparing a laminate for a light emitting device containing an interface void layer.

Example 6: Preparation of a Laminate for a Light Emitting Device with Potassium-Containing Glass Substrate A laminate for a light emitting device comprising an interface void layer is prepared in the same process as Example 1, except the concentration of $Na_2O$ and $K_2O$ contained in the glass substrate. The concentration of $Na_2O$ is 5 wt % and that of $K_2O$ is 6 wt %. The glass substrate is prepared as described in an embodiment of U.S. Pat. No. 6,905,991 (see Composition 10 in ANNEX, columns 11 and 12).

Example 7: Preparation of a Laminate for a Light Emitting Device Comprising a Double Layered Internal Light Extraction Layer After forming the glass layer containing interface void layer with the same composition and process conditions as described in Example 1 (the first glass frit layer), the second glass frit layer having a thickness of about 1 to 5 μm is formed on the first glass frit layer to secure the flatness of the outermost surface of the internal light extraction layer and prevent the flatness of the outermost surface being degraded by the interface void layer. The composition of the second glass frit paste is the same as that of the glass frit paste described in Example 1 (the first glass frit paste). The second glass frit layer is formed by coating the second glass frit paste on the first glass frit layer using screen printing, and performing the remaining processes in the same processes as Example 1. Total thickness of the first glass frit layer and the second glass frit layer is 25 μm and the flatness of the outermost surface of the internal light extraction layer (the first glass frit layer+the second glass frit layer) satisfies the condition of ΔRa<1 nm.

Comparative Example 1: Preparation of a Laminate for a Light Emitting Device A laminate for a light emitting device is prepared in the same process as Example 4, except that a surface is not treated with a potassium ion.

Comparative Example 2: Preparation of a Laminate for a Light Emitting Device A laminate for a light emitting device, which comprises a scattering type internal light extraction layer comprising 1.1 wt % of $TiO_2$ particles having a diameter of 400 nm and air bubbles which are generated by oxygen dissociated from oxides contained in a glass frit, as scattering elements, is prepared using the glass frit having the same composition as in the Examples. The scattering type internal light extraction layer has a thickness of 10 μm. On the scattering type internal light extraction layer, a second glass frit layer is stacked using the glass frit having the same composition as in the Examples without $TiO_2$, and then, sintered at a temperature of 545° C.

Comparative Example 3: Preparation of a Laminate for a Light Emitting Device A laminate for a light emitting device is prepared in the same process as Comparative Example 2, but the concentration of $TiO_2$ particles is increased to 2.0 wt %.

Comparative Example 4: Preparation of a Laminate for a Light Emitting Device A laminate for a light emitting device is prepared in the same process as Comparative Example 2, but the concentration of $TiO_2$ particles is decreased to 0.9 wt %.

Evaluating the Optical Characteristics of the Laminates for a Light Emitting Device Table 1 shows the transmittance and haze ratio of the laminates for a light emitting device prepared according to Examples 1 to 4 and Comparative Examples 1 to 4. Compared to the laminate of Comparative Example 1 in which an internal void layer is not formed, the total transmittance decreases, and the haze ratio increases considerably. Compared to the laminates of Comparative Examples 2 to 4 which comprise scattering elements, the haze ratios are superior. The total thickness of the light extraction layer is about 20 to 25 μm in all cases.

TABLE 1

| | Example 1 | Example 2 | Example 3 | Example 4 | Comparative Example 1 | Comparative Example 2 | Comparative Example 3 | Comparative Example 4 |
|---|---|---|---|---|---|---|---|---|
| Thickness of interface void layer (μm) | 3 | 2.5 | 2.5 | 2 | | | | |

TABLE 1-continued

|  | Example 1 | Example 2 | Example 3 | Example 4 | Comparative Example 1 | Comparative Example 2 | Comparative Example 3 | Comparative Example 4 |
|---|---|---|---|---|---|---|---|---|
| Thickness of scattering layer containing TiO$_2$ particles (μm) |  |  |  |  |  | 10 | 10 | 10 |
| Total transmittance (%) | 58.9 | 60.4 | 64.6 | 70.7 | 80.5 | 59.5 | 56.7 | 63.3 |
| Haze ratio (%) | 90.6 | 88.3 | 87.8 | 70.2 | 9.6 | 79.4 | 85.4 | 67.4 |

Figure 6:
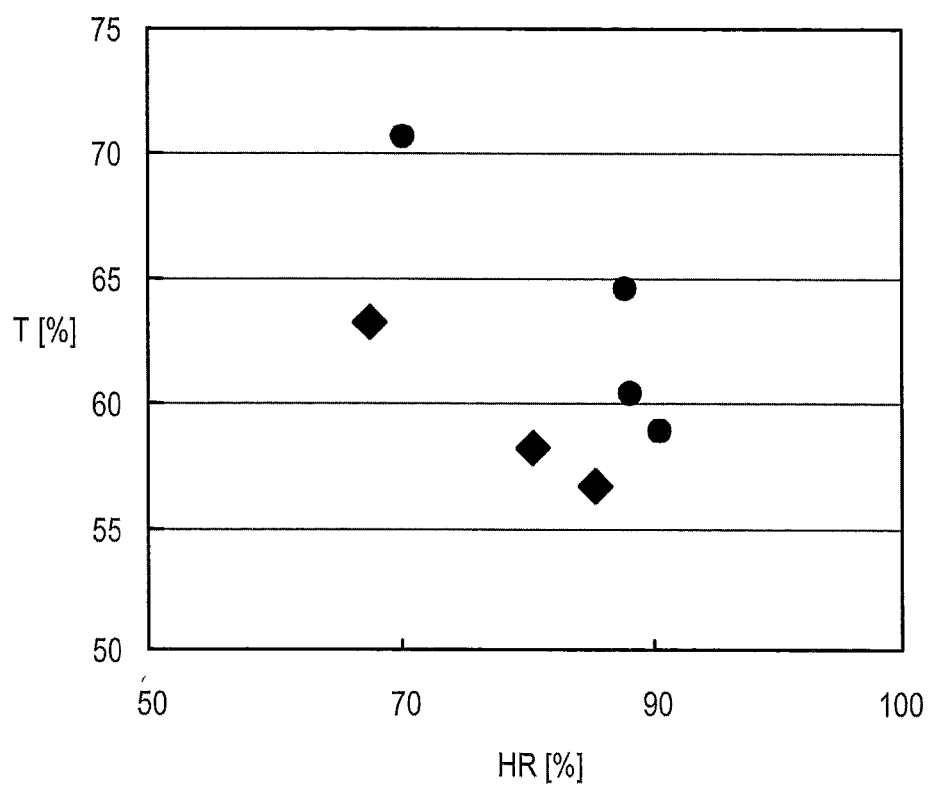
FIG. 6 is a graph showing a haze ratio to total transmittance of the laminate for a light emitting device according to an embodiment of the present invention.

FIG. 6 is a graph comparing the changes in the total transmittance in the range of visible light (X-axis) with respect to the haze ratio of the laminates (Y-axis) prepared in Examples 1 to 4 (marked as ●) and Comparative Examples 2 to 4 (marked as ♦). The total transmittance of the laminate for a light emitting device of the present invention is about 2% to 7% higher than that of a laminate for a light emitting device of the Comparative Examples having the same diffusive performance.

Figure 7:
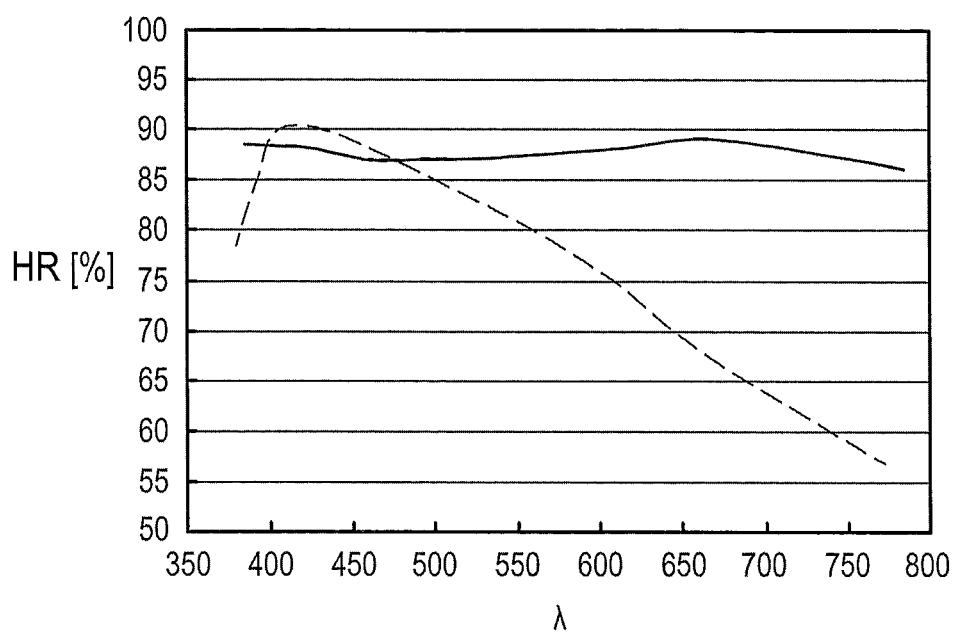
FIG. 7 is a graph showing a haze ratio of the laminate for a light emitting device according to an embodiment of the present invention.
Figure 8:
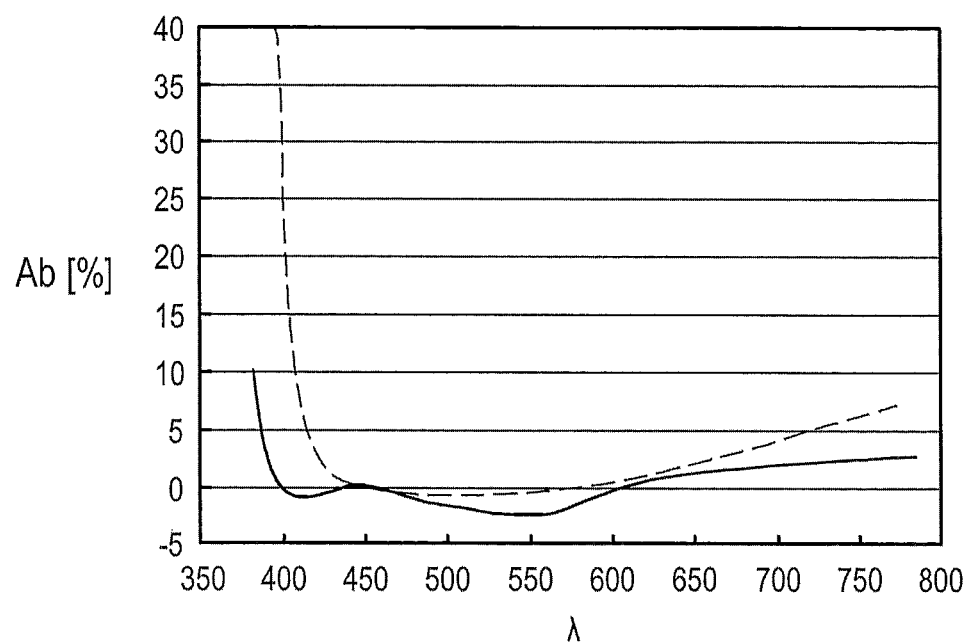
FIG. 8 is a graph showing an absorbance of the laminate for a light emitting device according to an embodiment of the present invention.
Figure 9:
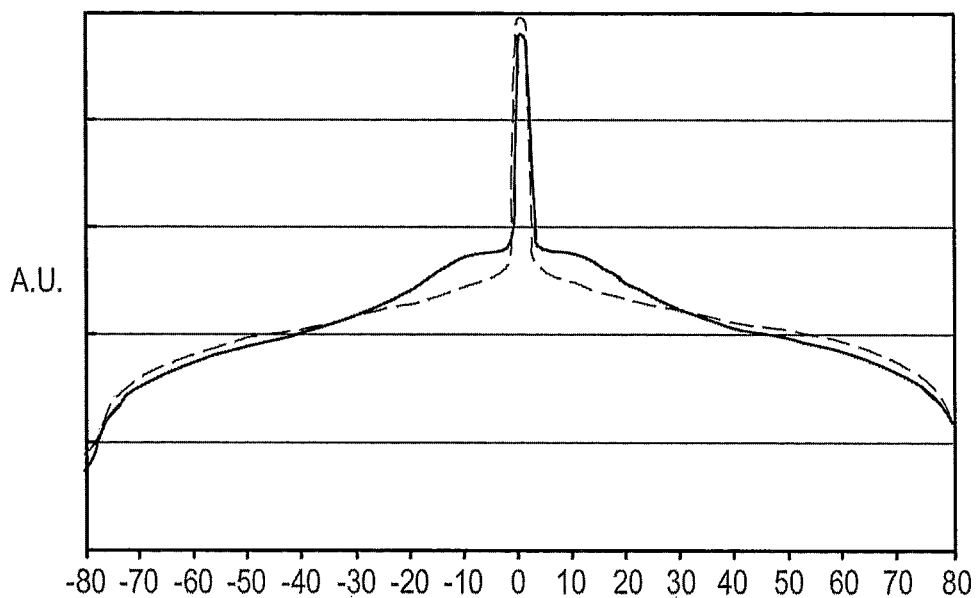
FIG. 9 is a graph showing an intensity distribution of light, externally emitted from the laminate for a light emitting device according to an embodiment of the present invention, with respect to a viewing angle.

FIGS. 7 to 9 are graphs comparing optical characteristics of the laminate for a light emitting device (illustrated as a solid line) prepared in Example 1 and those of the laminate for a light emitting device (illustrated as a dotted line) prepared in Comparative Example 2.

FIG. 7 is a graph showing the haze ratio. The X-axis shows the wavelength (λ) and the Y-axis shows the haze ratio (HR, %). The haze ratio of the laminate for a light emitting device according to the present invention (marked as solid line) is consistently uniform within an entire wavelength range of visible light. In the laminate for a light emitting device of Comparative Example 2 (marked as dotted line), however, the longer the wavelength, the lower the haze ratio. Thus, there is a 30% or more difference in the haze ratio between the maximum value and the minimum value.

FIG. 8 is a graph showing absorbance. The X-axis shows the wavelength (λ) and the Y-axis shows the absorbance (Ab, %). Absorbance of the laminate for a light emitting device according to the present invention (marked as solid line) is almost equal to that of the laminate for a light emitting device of Comparative Example 2 (marked as dotted line), within an entire wavelength range of visible light.

FIG. 9 is a graph showing an intensity distribution of externally emitted light with respect to a viewing angle. The X-axis shows the angle viewed from the front (°) and the Y-axis shows the intensity (A.U.). The laminate for a light emitting device according to the present invention (marked as solid line) has a light diffusing performance almost equal to the laminate for a light emitting device of Comparative Example 2 (marked as dotted line), over a viewing angle of −80° to 80°. However, the laminate for a light emitting device according to the present invention has a light concentration (light transmittance) far superior than the laminate for a light emitting device of Comparative Example 2, within a viewing angle of −20° to 20°.

Figure 10:
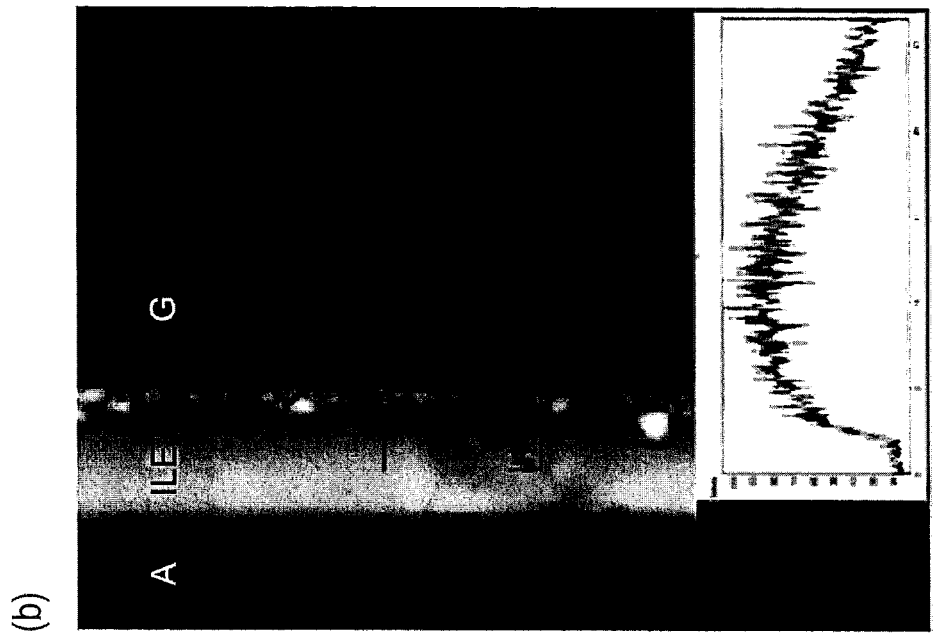
FIG. 10 are graphs showing the changes in a potassium ion concentration distribution and SEM photographs of a glass substrate after the glass substrate is potassium ion-treated by an ion exchanging method and the internal light extraction layer is formed on the glass substrate according to a process of the present invention.
Figure 10:
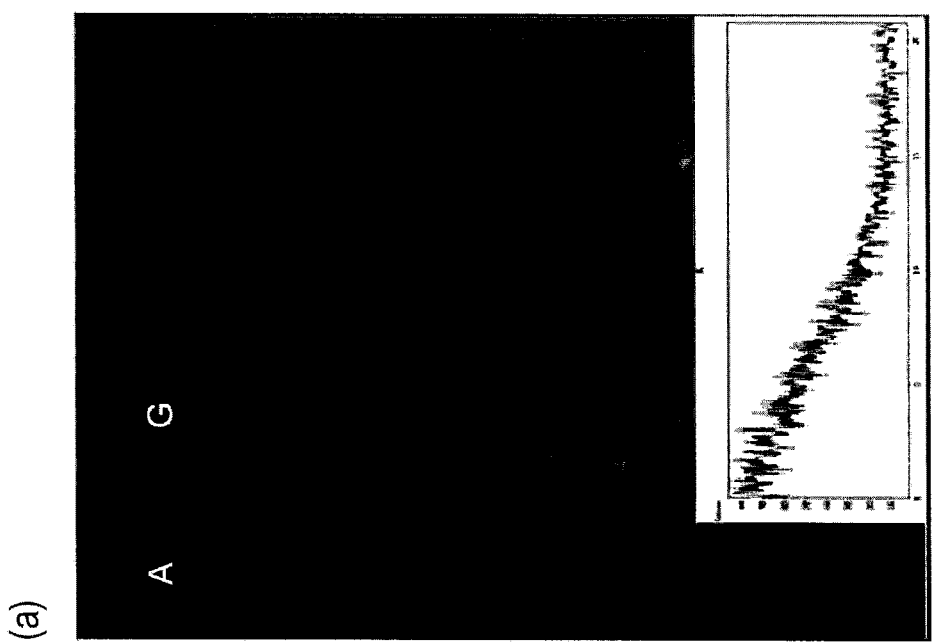

FIG. 10 shows distributions of potassium concentration of the substrate, which is treated with potassium by the ion exchanging method described in Example 4 (before sintering, left drawing, FIG. 10(a)), and the laminate for a light emitting device which a glass fit layer is applied on said substrate treated with potassium, and then, an internal light extraction layer is formed by sintering (after sintering, right drawing, FIG. 10(b)). Potassium ion concentration of the substrate treated with potassium becomes higher towards the surface. However, after the internal light extraction layer is formed by applying the glass frit layer on said substrate and sintering, potassium ions are diffused and move from the surface of the glass substrate to the internal light extraction layer.

Figure 11:
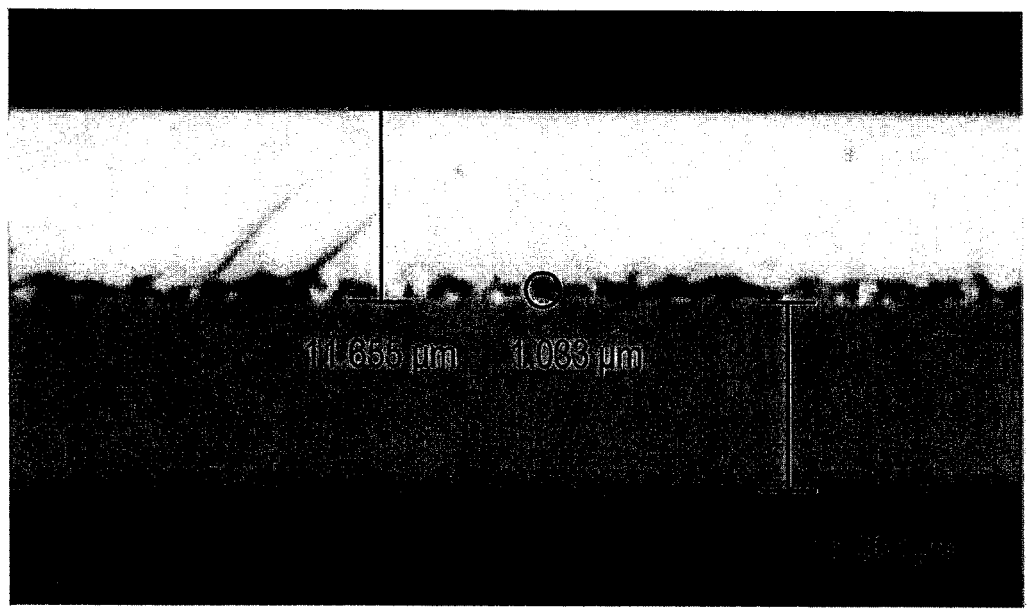
FIG. 11 is an SEM photograph showing a laminate for a light emitting device prepared by a method that forms a low-refractive index glass frit containing a large amount of potassium on a glass substrate.

FIG. 11 is an SEM photograph showing a cross section of the laminate for a light emitting device prepared in Example 5. The photograph shows the formation of the interface void layer between the low-refractive index glass frit layer and the internal light extraction layer. Therefore, the laminate for a light emitting device may be prepared by a method of coating the low-refractive index glass fit layer containing a potassium ion on a general glass substrate.

In summary, the laminate for a light emitting device of the present invention comprising the interface void layer can maintain optical characteristics, such as absorbance, etc., at a level equal to or more superior than the existing scattering type laminate for a light emitting device which uses an air bubble as a scattering factor, have a much superior total transmittance in the range of visible light and light transmittance in a vertical direction than conventional scattering type laminates for a light emitting device having the same diffusive performance, and have a far more uniform haze ratio than conventional scattering type laminates within an entire wavelength range of visible light.

INDUSTRIAL APPLICABILITY

A laminate for a light emitting device of the present invention can be widely used for light emitting devices requiring the effective extraction of light, and is particularly suitable for the fields of optical devices, such as organic light emitting diodes (OLEDs), backlights, lighting industry, etc., since it has superior optical characteristics.

SYMBOLS

ILE: Internal Light Extraction Layer (RI: 1.8~2.1)
G: Glass Substrate
V: Void (RI~1)
F: Glass Frit
EC: Ethyl Cellulose
A: Air

What is claimed is:
1. A laminate for a light emitting device, comprising:
a glass substrate comprising potassium or a glass substrate coated with a mineral layer comprising potassium; and
an internal light extraction layer formed from a glass frit having a refractive index (RI) of 1.8 to 2.1 on said glass substrate,
wherein the internal light extraction layer comprises an interface void layer at an interface with the glass substrate or the mineral layer.

2. The laminate of claim 1, wherein the glass substrate is a sodalime glass substrate.

3. The laminate according to claim 1, wherein a surface or the outermost region of the glass substrate is treated with potassium.

4. The laminate according to claim 1, wherein a surface of the glass substrate or the mineral layer comprises potassium at a concentration of 1 to 15% by weight.

5. The laminate according to claim 4, wherein the surface of the glass substrate or the mineral layer comprises potassium at a concentration of 5% by weight or less.

6. The laminate according to claim 1, wherein the interface void layer has a thickness of 1 to 5 μm, and wherein the interface void layer has a void area ratio of 40 to 90%.

7. The laminate according to claim 1, wherein said glass frit comprises 55 to 84% by weight of $Bi_2O_3$, 0 to 20% by weight of BaO, 5 to 20% by weight of ZnO, 1 to 7% by weight of $Al_2O_3$, 5 to 15% by weight of $SiO_2$, 5 to 20% by weight of $B_2O_3$, and 0.05 to 3% by weight of $Na_2O$, based on the total weight of the glass frit.

8. The laminate according to claim 1, wherein the internal light extraction layer has a single layer of glass frit comprising said interface void layer at an interface with the glass substrate or the mineral layer.

9. The laminate according to claim 1, wherein the internal light extraction layer has a first glass frit layer comprising the interface void layer at an interface with the glass substrate or the mineral layer and a second glass frit layer covering and in contact with the first glass frit layer.

10. The laminate according to claim 1, wherein the internal light extraction layer comprises a single or double layer of glass frit and is devoid of any scattering elements at the outermost surface.

11. The laminate according to claim 10, wherein the internal light extraction layer is devoid of any scattering elements at the outermost region of at least 2 μm from the outermost surface.

12. The laminate according to claim 1, wherein said internal light extraction layer has a total thickness of 6 to 30 μm.

13. The laminate according to claim 1, wherein said internal light extraction layer has an outermost surface roughness (Ra) of less than 1 nm.

14. The laminate according to claim 1, wherein a concentration of potassium becomes smaller from the interface between said glass substrate and said internal light extraction layer to an outermost surface of said internal light extraction layer.

15. The laminate according to claim 1, wherein potassium has a concentration of less than 1% by weight on an outermost surface of said internal light extraction layer.

16. The laminate according to claim 1, further comprising a transparent electrode layer formed on the laminate for a light emitting device.

17. A process of preparing a laminate for a light emitting device, comprising:
preparing a glass substrate comprising potassium;
applying a glass frit paste onto said glass substrate to form a first glass frit layer;
drying said first glass frit layer; and
sintering said dried first glass frit layer to form an internal light extraction layer having a refractive index of 1.8 to 2.1,
wherein the internal light extraction layer comprises an interface void layer at an interface with the glass substrate.

18. The process according to claim 17, further comprising:
applying another glass frit paste onto the sintered first glass frit layer to form a second glass frit layer;
drying the second glass frit layer; and
sintering the dried second glass frit layer at a predetermined second temperature to form a double frit layer structure for an internal light extraction layer having a refractive index of 1.8 to 2.1.

19. The process according to claim 17, wherein the concentration of potassium is smaller from the interface between the glass substrate or the mineral layer and the internal light extraction layer to an outermost surface of the internal light extraction layer.

20. The process according to claim 17, wherein the interface void layer has a thickness of 1 to 5 μm, and wherein the interface void layer has a void area ratio of 40 to 90%.

21. The process according to claim 17, wherein the outermost surface of the first or second glass frit layer comprises potassium at a concentration of less than 1% by weight.

22. The process according to claim 17, wherein the first glass frit layer is sintered at the first sintering temperature between 500° C. and 590° C.

23. The process according to claim 17, wherein the glass substrate is a sodalime glass substrate.

24. The process according to claim 17, wherein a surface or the outermost region of the glass substrate is treated with potassium.

25. The process according to claim 17, wherein a surface of the glass substrate comprises potassium at a concentration of 1 to 15% by weight.

26. The process according to claim 17, wherein the first glass frit comprises 55 to 84% by weight of $Bi_2O_3$, 0 to 20% by weight of BaO, 5 to 20% by weight of ZnO, 1 to 7% by weight of $Al_2O_3$, 5 to 15% by weight of $SiO_2$, 5 to 20% by weight of $B_2O_3$, and 0.05 to 3% by weight of $Na_2O$, based on the total weight of the glass frit.

27. The process according to claim 17, wherein the internal light extraction layer has a total thickness of 6 to 30 μm.

28. A process of preparing a laminate for a light emitting device, comprising:
preparing a glass substrate;
applying a glass frit paste comprising potassium on the glass substrate;
drying and sintering the glass substrate coated with the glass frit paste to form a glass substrate coated with a mineral layer comprising glass frit comprising potassium;
applying a glass frit paste onto the glass substrate coated with the mineral layer to form a first glass frit layer;
drying the first glass frit layer; and
sintering the dried first glass frit layer at a predeterminated first temperature to form an internal light extraction layer having a refractive index of 1.8 to 2.1,
wherein the internal light extraction layer comprises an interface void layer at an interface with the mineral layer.

29. The process according to claim 28, further comprising:
applying another glass frit paste onto the sintered first glass frit layer to form a second glass frit layer;
drying the second glass frit layer; and
sintering the dried second glass frit layer at a predetermined second temperature to form a double frit layer structure for an internal light extraction layer having a refractive index of 1.8 to 2.1.

30. The process according to claim 28, wherein the concentration of potassium is smaller from the interface between the glass substrate or the mineral layer and the internal light extraction layer to an outermost surface of the internal light extraction layer.

31. The process according to claim 28, wherein the interface void layer has a thickness of 1 to 5 μm, and wherein the interface void layer has a void area ratio of 40 to 90%.

32. The process according to claim 28, wherein the outermost surface of the first or second glass frit layer comprises potassium at a concentration of less than 1% by weight.

33. The process according to claim 28, wherein the first glass frit layer is sintered at the first sintering temperature between 500° C. and 590° C.

34. The process according to claim 28, wherein the glass substrate is a sodalime glass substrate.

35. The process according to claim 28, wherein a surface or the outermost region of the glass substrate is treated with potassium.

36. The process according to claim 28, wherein a surface of the glass substrate comprises potassium at a concentration of 1 to 15% by weight.

37. The process according to claim 28, wherein the first glass frit comprises 55 to 84% by weight of $Bi_2O_3$, 0 to 20% by weight of BaO, 5 to 20% by weight of ZnO, 1 to 7% by weight of $Al_2O_3$, 5 to 15% by weight of $SiO_2$, 5 to 20% by weight of $B_2O_3$, and 0.05 to 3% by weight of $Na_2O$, based on the total weight of the glass fit.

38. The process according to claim 28, wherein the internal light extraction layer has a total thickness of 6 to 30 μm.

* * * * *